United States Patent
Mista et al.

[11] Patent Number: 5,824,959
[45] Date of Patent: Oct. 20, 1998

[54] FLEXIBLE ELECTRICAL CABLE AND ASSOCIATED APPARATUS

[75] Inventors: Kresimir Mista, Heusenstamm; Hans Juergen Hoehne, Hainburg, both of Germany

[73] Assignee: Karl Mayer Textilmachinenfabrik GmbH, Obertshausen, Germany

[21] Appl. No.: 740,240

[22] Filed: Oct. 25, 1996

[30] Foreign Application Priority Data

Nov. 2, 1995 [DE] Germany .................. 195 40 807.1

[51] Int. Cl.⁶ .................................................. H01B 7/08
[52] U.S. Cl. ........................ 174/117 F; 174/117 FF; 174/124 R
[58] Field of Search ................ 174/117 F, 117 FF, 174/122 R, 124 R, 126.2

[56] References Cited

U.S. PATENT DOCUMENTS

| | | | |
|---|---|---|---|
| 4,735,847 | 4/1988 | Fujiwara et al. | 428/209 |
| 4,960,965 | 10/1990 | Redmon et al. | 174/102 R |
| 4,981,442 | 1/1991 | Shimizu et al. | 439/394 |
| 5,218,171 | 6/1993 | Aldissi | 174/126.2 X |
| 5,533,366 | 7/1996 | Mista et al. | 66/205 |

FOREIGN PATENT DOCUMENTS

| | | | |
|---|---|---|---|
| 3930496 | 6/1991 | Germany . | |
| 4239982 | 6/1993 | Germany | 174/117 F |
| 4418714 | 6/1995 | Germany | 66/205 |

*Primary Examiner*—Kristine L. Kincaid
*Assistant Examiner*—Chau N. Nguyen
*Attorney, Agent, or Firm*—Omri M. Behr, Esq.

[57] ABSTRACT

A flexible electric cable (1) has a conductor (2,3) and a fiber layer (4,5) of electrically conductive fibers which are in contact therewith. A cable of this type (1) is particularly suitable for electrical connection between two components that can move In relation to each other, one of which carries numerous activating elements, which may be controlled by voltage pulses. In this way, cables which are under stress through vibration, bending and tension stress, etc., can retain their function over a longer period.

9 Claims, 1 Drawing Sheet

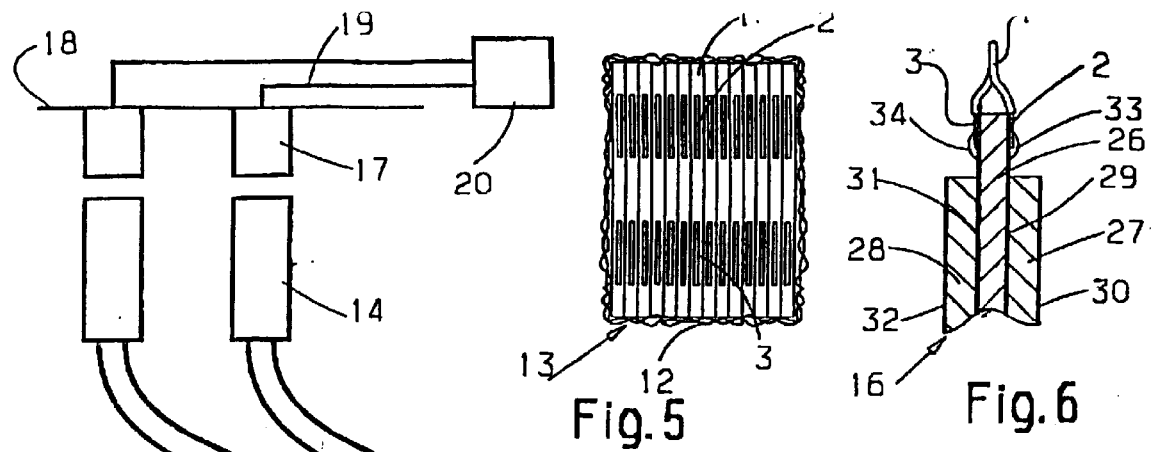
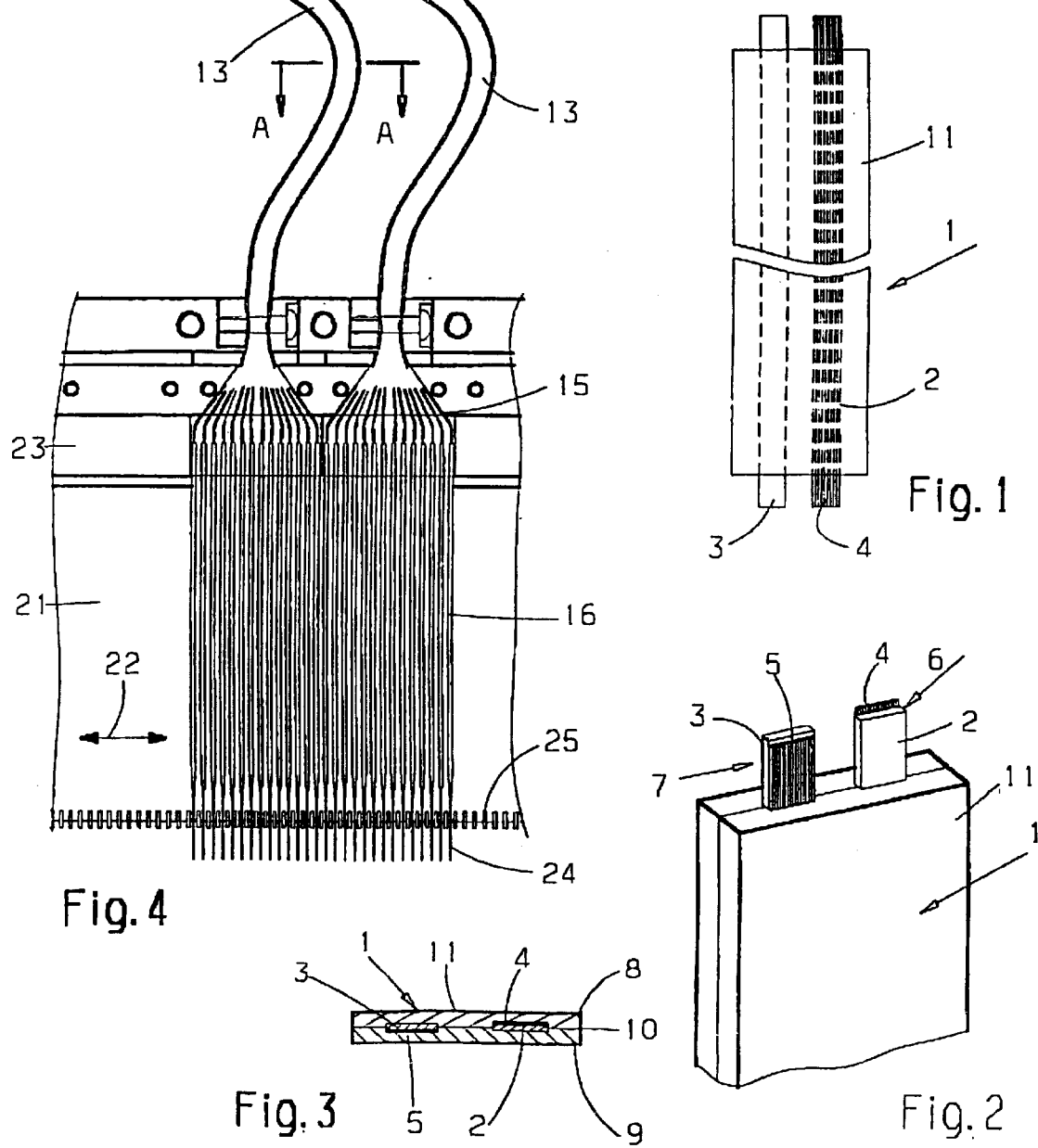

FLEXIBLE ELECTRICAL CABLE AND ASSOCIATED APPARATUS

BACKGROUND OF THE INVENTION

1. Field of the Invention

The present invention relates to flexible electric cables with at least one conductor and an insulating sleeve of plastic and to an application of this cable.

2. Description of Related Art

A cable of this type in the form of a two or three-wire flat cable is known from DE 44 18 714 Cl. It is used for electrical connection between connection points on the machinery frame of a warp knitting machine and piezoelectric transducers serving as activating elements. These elements are attached to a guide bar, which can be reciprocated axially, and are used for Jacquard control of the guide. The conductors of this cable are soldered, welded or connected in some other way at one end to plug contacts and at the other end to connection contacts of the transducers. In each case, several flat cables are laid one upon the other and put together to make a cable bundle.

When used for this and similar purposes, there is a risk that due to the continual stressing of the conductors by vibration, bending, tension, etc., the conductors in the form of strips will break and consequently make the cable unusable. This risk is not remedied by using thicker conductors or a thicker cable, rather it is Increased because of the increased rigidity. Equally, any reduction In thickness has its limits.

Accordingly, there is a need for an electrical cable of the form described at the outset, which does not fail even when under considerable stress from vibration, bending, tension, etc.

SUMMARY OF THE INVENTION

In accordance with the illustrative embodiments demonstrating features and advantages of the present invention, there is provided a flexible electrical cable having at least one elongate conductor. Also included is a fiber layer with electrically conductive fibers disposed along and in contact with the conductor. The cable also has an insulating sleeve of plastic encompassing at least the conductor.

In accordance with another aspect of the invention, an apparatus having a pair of components employs the above flexible cable. The pair of components are adapted to move in relation to each other. The apparatus also has a plurality of activating elements mounted on one of the components and is adapted to be controlled by voltage pulses. The flexible cable interconnects the pair of components for conveying electrical pulses to the activating elements.

According to still another aspect of the invention, apparatus having the above flexible cable is employed in a warp knitting machine that has a plurality of guides. This apparatus includes a frame and a guide bar mounted at the frame to reciprocate. Also included is a plurality of piezoelectric transducers mounted on the guide bar and adapted to be controlled by voltage pulses for Jacquard control of the guides.

In preferred embodiments a conductor is place in contact with a fiber layer made of electrically conductive fibers. The preferred fiber layer forms an electrically conductive layer running parallel to the conductor, which has reduced risk of breakage. If the conductor Itself should break, the fiber layer bridges over the fracture point, so that the cable continues to function. The increase in resistivity arising from this is minimal, since as the fiber layer and conductor are in contact, the higher specific resistance of the fiber layer is only effective at the fracture point, but the lower specific resistance of the conductor material operates over the entire remaining length.

The advantages of the conductor, i.e. its very high conductivity and its ability to be soldered or welded, which is important for the connection, are maintained. In addition, the fiber layer serves to increase the mechanical strength of the cable, in particular against tension stresses.

It is particularly advantageous if the conductor takes the form of a flat strip and the fiber layer is placed against the wide side of the strip. The strip form, which is already known and makes a considerable contribution to flexibility, is exploited to produce the maximum area of contact with the fiber layer.

In addition, it is useful if at least one layer, consisting of conductor and a fiber layer, is placed between two plastic sheets, these being welded to each other on either side of the layer. Overall, the layer and sheet can be kept very flat. Consequently, this produces an extremely flexible electric cable.

It is also to be recommended that two conductors should be arranged adjacent to each other, with the relevant fiber layers running on sides opposite each other. If the fiber layers have any influence upon bending behavior, to a large extent such influence is neutralized by the arrangement described.

Preferably, the conductor consists of copper and has a maximum thickness of 0.2 mm. For reasons of greater flexibility It is desirable to make the conductor as thin as possible, particularly in the size range of 0.1 mm. Because of the presence of the fiber layer, the risk of cracking or breakage which exists with very thin conductors is unimportant as regards functioning of the cable.

It is advantageous for the fibers to be carbon fibers. These have a high module of elasticity with low electrical resistance. Consequently, a very thin fiber layer is sufficient.

Preferably, the fiber layer consists of fibers which are uninterrupted over the length of the conductor. This produces the best electrical and mechanical properties. It is sufficient if the fibers are simply placed next to each other, producing the lowest possible thickness. However, this does not exclude the use of fiber layers consisting of twisted fibers, woven or knit strands, etc.

Preferably, the electrical cable described here is used for electrical connection between two components which in relative terms can move in relation to each other, one of which carries numerous activating elements that can be controlled by voltage pulses. Since, as a consequence of the voltage pulses, a current flows only for a brief period, there is no fear of unacceptable heating of the fiber layer in the area of the fracture points of the conductors. If numerous flexible cables are needed, the facility provided by the invention of using very flat cables can assist in fully exploiting the restricted space available.

In another form, there is provision for several flat cables to be laid one upon the other and put together In a cable bundle, the conductors of which are joined to plug contacts at one end and at the other end to the activating elements. In this way, very flexible cable bundles are produced with effective cables, which can have their ends soldered or welded to the plug contacts or the connection points on the activating elements.

It is further preferred that the activating elements are piezoelectric transducers attached to a guide rail, which can be moved backwards and forwards axially, of a warp knitting machine, for Jacquard control of the guide needles. In this type of application, the cables are subjected to exceptionally severe loadings. The present teachings can give the cable a significantly longer life than previously.

Piezoelectric transducers are charged and discharged in the manner of a condenser. With this there Is automatically a short charging or discharging pulse, which does not create any excessive heat in the fiber layer.

BRIEF DESCRIPTION OF THE DRAWINGS

The above brief description as well as other objects, features and advantages of the present invention will be more fully appreciated by reference to the following detailed description of presently preferred but nonetheless illustrative embodiments in accordance with the present invention when taken in conjunction with the accompanying drawings, wherein:

FIG. 1 is a side view of a cable in accordance with the principles of the present invention;

FIG. 2 is an axonometric view of an end of the cable of FIG. 1;

FIG. 3 is a cross-sectional view of the cable of FIG. 1;

FIG. 4 is a view of part of a warp knitting machine with a cable bundle made of the cables of FIG. 1;

FIG. 5 is a sectional view taken along the line A—A of FIG. 4; and

FIG. 6 is a longitudinal section showing the connection between the end of the cable and a piezoelectric transducer of FIG. 4.

DETAILED DESCRIPTION OF THE PREFERRED EMBODIMENTS

Referring to FIGS. 1, 2 and 3, the flexible elastic cable 1 has two copper conductors 2 and 3 in the form of tape or strip. One of the wide sides of conductor 2 is provided with a fiber layer 4 made of carbon fibers and conductor 3 has a fiber layer 5, made of carbon fibers, on the opposite wide side. The fibers need only be joined together loosely and fundamentally run in the direction of conductors 2 and 3. The two layers 6 and 7 of copper and carbon fibers are placed between two plastic sheets 8 and 9, these being joined to each other on both sides of the layers by weld seams 10. This creates a totally closed sleeve of plastic 11 all around.

The conductors 2 and 3 are made of copper. However, it is also possible to use other electrically conductive materials, such as aluminum. Preferably, the fiber layers 4 and 5 consist of carbon fibers. The plastic sleeve may consist of polyethylene, polytetrafluoroethylene, polyamide, polyurethane or some other electrically insulating plastic. The conductors 2 and 3 can also carry a fiber layer on both sides.

Dimensions of conductors 2 and 3 can be kept very small. For example, the thickness may be only 0.2 mm or less; possibly even 0.05 mm. The width can be 0.5 to 2 mm, preferably 0.5 to 1 mm. The external dimensions of the sleeve are likewise small. The height is between 0.1 and 0.5 mm, preferably around 0.16 mm, and the width between 3 and 8 mm, preferably around 5 mm. Preferably, one would use carbon fiber layers with 67 to 200 tex, where the number of fibers per conductor can be between 200 and 3,000.

FIGS. 4–6 show an exemplary application of the cable according to the principles of the present invention. Several specimens of cable 1 are stacked one on the other as shown In FIG. 5 and bound into a cable bundle 13 using a sleeve 12, such as a fabric hose. The conductors 2 and 3 of this cable bundle are connected at one end to the contacts of a plug 14 and at the other end to the connection ends 15 of piezoelectric transducers 16. See DE 44 18 714 Cl for further information on transducer assemblies.

The plugs 14 are connected to sockets 17, which are attached to the machine frame 18 of a warp knitting machine and connected via control wires 19 with a control device 20. The piezoelectric transducers 16 are attached to a guide bar 21 of the warp knitting machine, but can easily be released. This guide bar 21 is moved back and forth in the direction of the arrow 22 by an aligning device (not shown). The piezoelectric transducers 16 are attached to the top 23 of the guide bar 21 and at the lower end have guides 24, which can be moved back and forth between two adjacent stops 25 under the control of the transducers.

A transducer 16 of this type has a carrier 26 in the form of a strip made of electrically insulating material, such as fiberglass-reinforced plastic, each side of which carries an active layer 27 and 28 of piezoelectric material. The active layer 27 has an internal electrode 29 and an external electrode 30. The active layer 28 has an internal electrode 31 and an external electrode 32. The two conductors 2 and 3 of cable 1 form control wires, which are connected by means of gluing, soldering or welding at points 33 and 34 to the internal electrodes 29 and 31 which project above the active layers 27 and 28. The two external electrodes 30 and 32 are grounded by being connected to parts carrying ground potential of the machine frame. If a control voltage is applied to one of the internal electrodes of a transducer, the relevant guide needle is selectively shifted from a central position to one or the other stop 25. For further details reference is made to DE 44 18 714 Cl.

Obviously, many modifications and variations of the present invention are possible in light of the above teachings. It is therefore to be understood that within the scope of the appended claims, the invention may be practiced otherwise than as specifically described.

We claim:

1. A flexible electrical cable comprising:
   at least one elongate conductor including a flat strip having a wide side, the conductor being made of copper and having a maximum thickness of 0.2 mm;
   a fiber layer having electrically conductive fibers disposed along and in contact with the conductor, the fiber layer being adjacent to the wide side of the flat strip and lying on only one flat side of the strip; and
   an insulating sleeve of plastic encompassing said at least one conductor.

2. A flexible electrical cable according to one of claim 1, wherein said at least one conductor comprises:
   a pair of conductive members arranged side by side, said fiber layer having a corresponding pair of layer portions disposed on said pair of conductive members, separately and on opposite sides.

3. A flexible electrical cable according to one of claim 1, wherein the fiber layer comprises a plurality of carbon fibers.

4. A flexible electrical cable according to one of claim 1, wherein the fiber layer fundamentally comprises:
   substantially uninterrupted fibers extending longitudinally alongside the conductor.

5. A flexible electrical cable comprising:
   at least one elongate conductor including a flat strip having a wide side; a fiber layer having electrically conductive fibers disposed along and in contact with the conductor, the fiber layer being adjacent to the wide side of the flat strip; and an insulating sleeve having a pair of sheets of plastic encompassing said at least one conductor, the conductor and the fiber layer being arranged in a region between the pair of plastic sheets, said pair of plastic sheets being welded to each other on opposite sides of the region containing the conductor and the fiber layer.

6. A flexible electrical cable according to one of claim 5, wherein the conductor is made of copper and has a maximum thickness of 0.2 mm.

7. A flexible electrical cable according to one of claim 5, wherein the fiber layer comprises a plurality of carbon fibers.

8. A flexible electrical cable according to one of claim 5, wherein the fiber layer fundamentally comprises:

substantially uninterrupted fibers extending longitudinally alongside the conductor.

9. A flexible electrical cable comprising:

at least one elongate conductor having a flat strip with a wide side:

a fiber layer having electrically conductive fibers disposed along and in contact with the conductor, the fiber layer being adjacent to the wide side of the flat strip; and an insulating sleeve of plastic encompassing said at least one conductor, said at least one conductor including:

a pair of conductive members arranged side by side, said fiber layer having a corresponding pair of layer portions disposed on said pair of conductive members, separately and on opposite sides.

* * * * *

UNITED STATES PATENT AND TRADEMARK OFFICE
CERTIFICATE OF CORRRECTION

PATENT NO. : 5,824,959
DATED : October 20, 1998
INVENTOR(S) : Mista et al.

It is certified that error appears in the above-identified patent and that said Letters Patent is hereby corrected as shown below:

On the title page, in item [56] References Cited, Foreign Patent Documents, insert the following:

FOREIGN PATENT DOCUMENTS

| | | DOCUMENT NUMBER | | | | | PUBLICATION DATE | COUNTRY OR PATENT OFFICE | CLASS | SUBCLASS | TRANSLATION YES | NO |
|---|---|---|---|---|---|---|---|---|---|---|---|---|
| | | SHO | 57 | 60 | 2 | 7 | 1 | 4/23/82 | Japan | | | | |
| | | SHO | 63 | 11 | 53 | 5 | 0 | 9/01/88 | Japan | | | | |
| | | SHO | 62 | 25 | 0 | 1 | 4 | 2/23/87 | Japan | | | | |
| | | | | | | | | | | | | | |

Signed and Sealed this

Sixth Day of April, 1999

*Attest:*

Q. TODD DICKINSON

*Attesting Officer*  *Acting Commissioner of Patents and Trademarks*